United States Patent
Yeh et al.

(10) Patent No.: US 7,901,963 B2
(45) Date of Patent: Mar. 8, 2011

(54) SURFACE ROUGHENING METHOD FOR LIGHT EMITTING DIODE SUBSTRATE

(75) Inventors: Nien-Tze Yeh, Taoyuan County (TW); Chia-Ming Lee, Yilan County (TW)

(73) Assignee: Tekcore Co., Ltd., Nantou (TW)

(*) Notice: Subject to any disclaimer, the term of this patent is extended or adjusted under 35 U.S.C. 154(b) by 202 days.

(21) Appl. No.: 12/018,086

(22) Filed: Jan. 22, 2008

(65) Prior Publication Data
US 2009/0186435 A1    Jul. 23, 2009

(51) Int. Cl.
*H01L 21/00*   (2006.01)
(52) U.S. Cl. .............. 438/29; 257/94; 257/E33.074
(58) Field of Classification Search ............ 438/693, 438/29; 257/94, 98
See application file for complete search history.

(56) References Cited

U.S. PATENT DOCUMENTS

| 6,018,379 | A   | * | 1/2000  | Mizobata et al. ............ 349/112 |
| 6,870,193 | B2  |   | 3/2005  | Takeya et al. |
| 2003/0214718 | A1 | * | 11/2003 | Kaminsky et al. ............ 359/599 |
| 2007/0297729 | A1 | * | 12/2007 | Kodama et al. ................ 385/94 |

* cited by examiner

*Primary Examiner* — Phat X Cao
*Assistant Examiner* — Nga Doan
(74) *Attorney, Agent, or Firm* — Muncy, Geissler, Olds & Lowe, PLLC

(57) ABSTRACT

The present invention discloses a surface roughening method for an LED substrate, which uses a grinding technology and an abrasive paper of from No. 300 to No. 6000 to grind the surface of a substrate to form a plurality of irregular concave zones and convex zones on the surface of the substrate. Next, a semiconductor light emitting structure is formed on the surface of the substrate. The concave zones and convex zones can scatter and diffract the light inside LED, reduce the horizontally-propagating light between the substrate and the semiconductor layer, decrease the probability of total reflection and promote LED light extraction efficiency.

4 Claims, 2 Drawing Sheets

SURFACE ROUGHENING METHOD FOR LIGHT EMITTING DIODE SUBSTRATE

FIELD OF THE INVENTION

The present invention relates to a surface roughening method for an LED substrate, particularly to a method to form an irregular serrated structure on a substrate.

BACKGROUND OF THE INVENTION

Improving LED (Light Emitting Diode) light efficiency is a top priority for realizing a solid-state illuminator. There are two approaches to improve LED light efficiency: one is to increase LED internal quantum efficiency, and the other is to increase LED light extraction efficiency.

Improving the quality of epitaxial material can most directly and obviously promote internal quantum efficiency. An ELOG (Epitaxial Lateral Over-Growth) technology is used to improve the quality of epitaxial material, wherein gallium nitride layer is laterally overgrown on the substrate having patterned silicon-dioxide strips, and whereby threading dislocations are reduced, and internal quantum efficiency is increased.

An LEPS (Lateral Epitaxial Pattern Substrate) technology has the same effect as ELOG. The LEPS technology uses a dry- or wet-etching method to form patterns on the substrate, which not only has a simple fabrication process but also can reduce the time for epitaxial growth. This technology can also effectively reduce threading dislocations and increase LED light efficiency.

There is a great difference between the refractive indexes of a semiconductor and a packaging material; therefore, an LED usually has a small total reflection critical angle. The light generated by LED reaching an interface by an angle greater than the total reflection critical angle will be totally reflected back to the interior of the LED chip. Then, the probability that light leaves a semiconductor from an interface decreases, and photons can only be totally reflected inside a chip until they are completely absorbed and converted into heat. Thus, LED has an insufficient light efficiency.

Changing the geometry of LED is an effective measure to improve LED light efficiency. A U.S. Pat. No. 6,870,193 disclosed a semiconductor light emitting element, which has a concave and/or convex structure formed on the substrate. Compared with a planar substrate, such a structure can scatter or diffract the horizontally-propagating light with the concave or convex structure and thus can greatly promote external quantum efficiency. Further, applying ELOG to the concave or convex structure of the substrate can reduce the threading dislocations of the gallium nitride layer and promote the internal quantum efficiency of LED.

In the abovementioned conventional technology, the fabrication process of the concave or convex structure includes: forming a passivation layer on a substrate; patterning the geometry of the concave or convex structure on the passivation layer with a photolithographic process and etching the substrate to form the concave or convex structure with a dry- or wet-etching method. However, such a process is more complicated, unstable and cost-inefficient, which will impair the commercialization of LED.

SUMMARY OF THE INVENTION

The present invention proposes a surface roughening method for an LED substrate, which uses a simple, stable, cost-efficient and high-productivity fabrication process to form an irregular serrated surface on the substrate to promote LED external quantum efficiency and solve the conventional problems.

According to the present invention, the surface roughening method for an LED substrate comprises: providing a substrate, wherein the substrate is made of sapphire ($Al_2O_3$), silicon carbide (SiC), silicon (Si), gallium arsenide (GaAs), aluminum nitride (AlN), or gallium nitride (GaN); and grinding the surface of the substrate with a grinding technology and an abrasive paper of from No. 300 to No. 6000 to form a plurality of concave and convex zones on the surface of the substrate, wherein the height difference between the concave zones and the convex zones is from 0.05 to 15 µm.

Then, the surface of the substrate is thoroughly cleaned, and a semiconductor light emitting structure is formed on the surface of the substrate, wherein an ELOG (Epitaxial Lateral Over-Growth) technology or an LEPS (Lateral Epitaxial Pattern Substrate) technology is used to fill up the concave and convex zones with no pore formed. The concave and convex structures can scatter and diffract the light inside LED, reduce the horizontally-propagating light between the substrate and the semiconductor layer, decrease the probability of total reflection and promote LED light extraction efficiency.

The advantage of the present invention is to use a novel surface roughening method for an LED substrate, which uses a simple, stable, cost-efficient and high-productivity grinding technology to form an irregular serrated surface on the substrate. The irregular serrated surface can scatter and diffract the light inside LED, reduce the horizontally-propagating light between the substrate and the semiconductor layer, decrease the probability of total reflection and promote LED light extraction efficiency. Therefore, the present invention benefits mass-production in industry.

DETAILED DESCRIPTION OF THE PREFERRED EMBODIMENTS

The technical contents of the present invention are to be described in detail with embodiments. However, it should be understood that the embodiments are only to exemplify the present invention but not to limit the scope of the present invention.

Refer to from FIG. 1 to FIG. 4. In one embodiment of the present invention, the surface roughening method comprises: providing a substrate 100 (shown in FIG. 1), wherein the substrate 100 is made of sapphire ($Al_2O_3$), silicon carbide (SiC), silicon (Si), gallium arsenide (GaAs), aluminum nitride (AlN), or gallium nitride (GaN); grinding the surface of the substrate 100 with a grinding technology and an abrasive paper of from No. 300 to No. 6000 to form a plurality of concave zones 110 and convex zones 120 (shown in FIG. 2) on the surface of the substrate 100, wherein the height difference between the concave zones 110 and the convex zones 120 is from 0.05 to 15 µm, which is equivalent to the coarseness of the abrasive paper.

Figure 1:
FIG. 1 is a diagram schematically showing a substrate according to one embodiment of the present invention.
Figure 2:
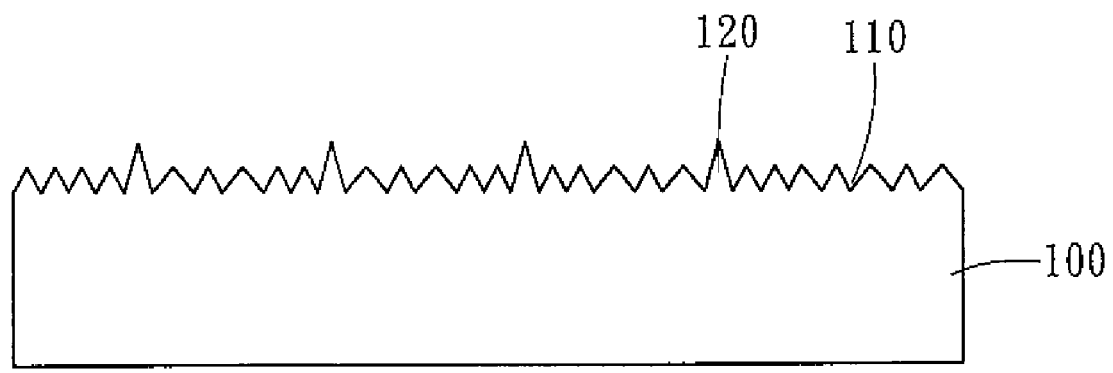
FIG. 2 is a diagram schematically showing a substrate having been ground according to one embodiment of the present invention.
Figure 3:
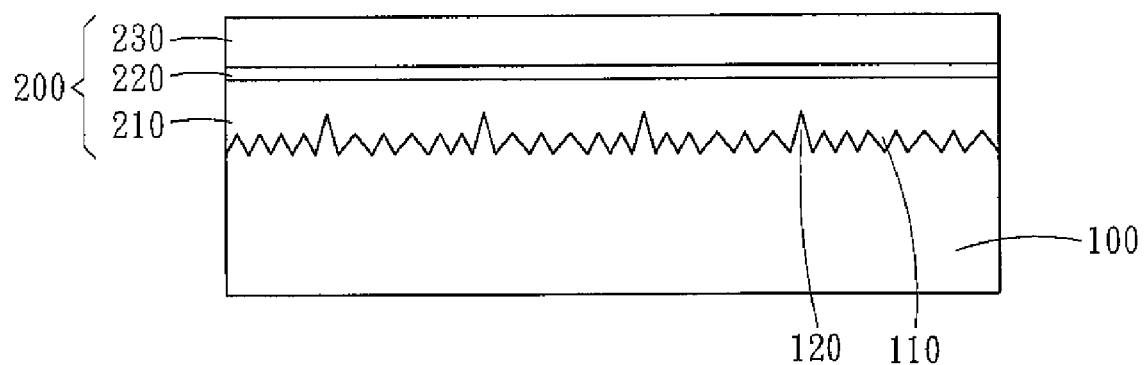
FIG. 3 is a diagram schematically showing epitaxial layers formed on the surface of the substrate according to one embodiment of the present invention.
Figure 4:
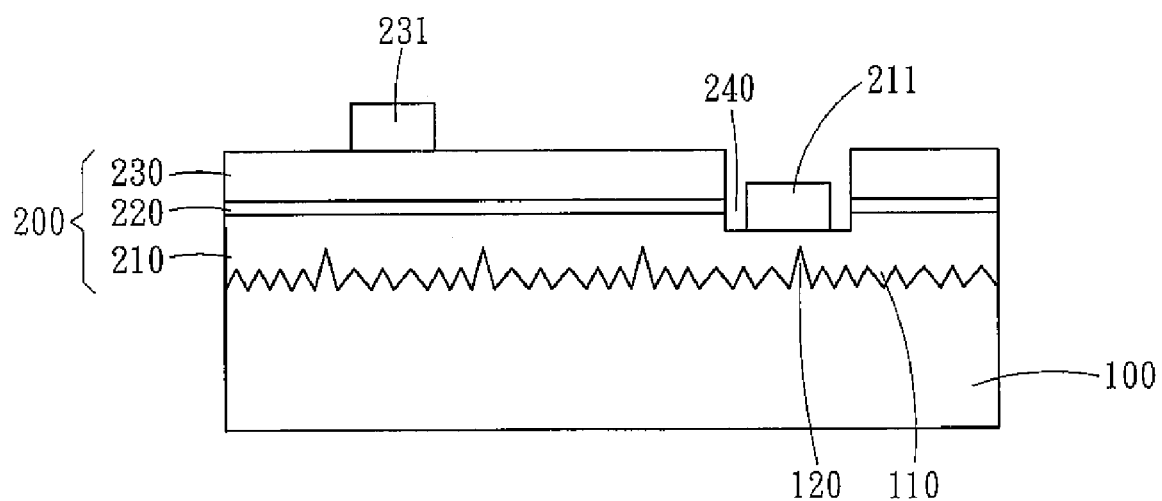
FIG. 4 is a diagram schematically showing an LED structure according to one embodiment of the present invention.

Then, a semiconductor light emitting structure 200 of LED is formed on the surface of the substrate 100 via epitaxially growing at least one n-type semiconductor layer 210, an active layer 220 and at least one p-type semiconductor layer 230 (shown in FIG. 3). The active layer 220 functions as the light emitting layer and is interposes between the n-type semiconductor layer 210 and the p-type semiconductor layer 230. The p-type semiconductor layer 230 is electrically coupled to a p-type ohmic contact electrode 231. The n-type semiconductor layer 210 is electrically coupled to an n-type ohmic contact electrode 211 via a contact window 240 (shown in FIG. 4). Thus, a forward bias can be applied to the LED.

In practical fabrication, an ELOG technology or an LEPS technology is used to adjust the pressure and temperature in the epitaxial growth and make the lateral growth faster than the longitudinal growth. Thereby, the n-type semiconductor layer 210, which has a greater thickness among the semiconductor light emitting structure 200, can fill up the abovementioned concave zones 110 and convex zones 120. Thus, the surface of the substrate 100 is free of pores around the concave zones 110 and convex zones 120, and a high-quality epitaxial layer with less threading dislocations is achieved. For example, a gallium nitride layer (about 15 µm thick) is grown as the n-type semiconductor layer 210 to fill up the abovementioned concave zones 110.

As the influence of the concave zones 110 and convex zones 120 on the active layer 220 is reduced, the active layer 220 (the light emitting layer) has a superior crystallinity and less threading dislocations. Then, the internal quantum efficiency is increased. The concave zones 110 and convex zones 120 will scatter or diffract the light emitted from the active layer 220 and thus decrease the horizontal light propagation in the interface between the substrate 100 and the n-type semiconductor layer 210 and reduce the probability of total reflection. Consequently, the light projecting upward or downward is increased. Then, the light extraction efficiency is increased, and the total light efficiency is promoted.

The preferred embodiments described above are only to exemplify the present invention but not to limit the scope of the present invention. Any equivalent modification or variation according to the spirit of the present invention is to be also included within the scope of the present invention.

What is claimed is:

1. A surface roughening method for a light emitting diode substrate comprising:
   providing a substrate;
   grinding said substrate with a grinding technology and an abrasive paper to form a plurality of irregular concave zones and convex zones on the surface of said substrate; and
   forming a semiconductor light emitting structure having two semiconductor layers with an active layer therebetween, one of said semiconductor layers being in contact with said substrate and having concave and convex zones reverse to those of said substrate.

2. The surface roughening method for the light emitting diode substrate according to claim 1, wherein said substrate is made of sapphire ($Al_2O_3$), silicon carbide (SiC), silicon (Si), gallium arsenide (GaAs), aluminum nitride (AlN), or gallium nitride (GaN).

3. The surface roughening method for the light emitting diode substrate according to claim 1, wherein said abrasive paper is of from No. 300 to No. 6000.

4. The surface roughening method for the light emitting diode substrate according to claim 1, wherein the height difference between said concave zones and said convex zones is from 0.05 to 15 µm.

* * * * *